United States Patent [19]

Nordin

[11] Patent Number: 4,564,722
[45] Date of Patent: Jan. 14, 1986

[54] CONTACTING DEVICE FOR PROTECTING ELECTRONIC COMPONENTS AGAINST ELECTROMAGNETIC RADIATION

[75] Inventor: Jerry K. G. Nordin, Mandolinvägen, Sweden

[73] Assignee: Telkefonaktiebolaget LM Ericsson, Stockholm, Sweden

[21] Appl. No.: 665,176

[22] Filed: Oct. 26, 1984

[30] Foreign Application Priority Data

Oct. 27, 1983 [SE] Sweden ............................ 8305908

[51] Int. Cl.⁴ .............................................. H05K 9/00
[52] U.S. Cl. ................................................ 174/35 GC
[58] Field of Search .......... 174/35 GC, 35 R, 35 MS; 219/10.55 D; 361/424; 455/300, 301

[56] References Cited

U.S. PATENT DOCUMENTS 3,277,230 10/1966 Stickney et al. ............... 174/35 GC
3,504,095 3/1970 Robertson et al. ............ 174/35 GC
3,505,463 4/1970 McAdams ..................... 174/35 GC Primary Examiner—Laramie E. Askin
Assistant Examiner—D. A. Tone
Attorney, Agent, or Firm—Roberts, Spiecens & Cohen

[57] ABSTRACT

A contacting device is provided for achieving conductive contact between casing parts in the form of flat walls provided for electronic equipment. The device comprises a metallic strip (2) placed in perforations (3, 4, 5) along the edges of the wall (1), so that the strip runs in a wave-like form on both sides of the wall.

2 Claims, 10 Drawing Figures

CONTACTING DEVICE FOR PROTECTING ELECTRONIC COMPONENTS AGAINST ELECTROMAGNETIC RADIATION

TECHNICAL FIELD

The present invention relates to a contacting device. The device is intended to achieve good contact between removable casing parts and to meet the requirements made with respect to electromagnetic interference and radio frequency interference.

BACKGROUND ART

In electronic units, such as display screen terminals, the casing usually comprises walls manufactured from conductive material, e.g. aluminium. The electronic components from which the terminal data circuits are built up are thus protected not only from dust and dirt, but also from other external effects in the form of electromagnetic or radio frequency interference fields from other apparatus. Is is also of importance to be able effectively to screen the terminal circuits from their environment because of the electromagnetic or radio frequency radiation coming from one terminal that can interfere with other terminals in the surroundings.

For this screening is required that the walls of the casing are in good electrical contact, so that no wave traps are created in the gaps between two walls, which would thus enable the occurrence of interfering radio waves.

It is previously known to achieve good contact between two adjacent walls in such a display screen terminal by screwing or adhering spring elements of metallic material, e.g. according to the U.S. Pat. No. 3,504,095, on one of the engagement surfaces between two meeting walls in the casing. There is thus obtained good screening of the terminal against its environment, but fitting the spring elements can be detailed and time-consuming.

DISCLOSURE OF INVENTION

The object of the present invention is to achieve a contacting device between the walls in a casing which screens electronic components or units from interference fields in its environment.

According to the inventive concept, resilient contact surfaces are created on one or both sides of the casing walls by placing a metallic strip or wire along the edges of the wall so that good contact is obtained between them.

BRIEF DESCRIPTION OF DRAWINGS

The invention will now be described in detail with reference to the accompanying drawing, wherein.

BEST MODES FOR CARRYING OUT THE INVENTION

Figure 1:
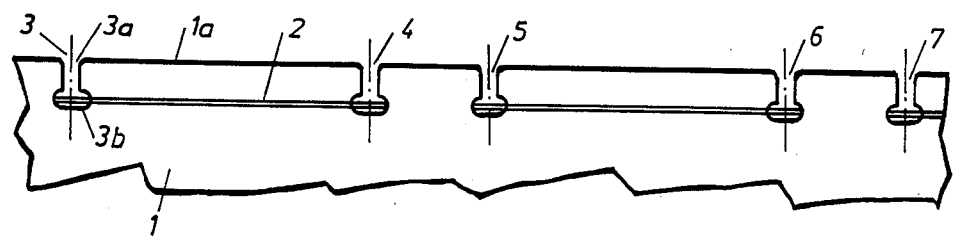
FIG. 1 is a side view of a portion of a casing wall provided with a contacting device in accordance with the invention.
Figure 2:
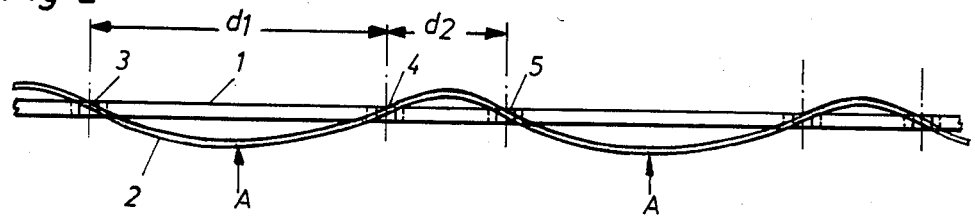
FIG. 2 illustrates the same part in a view from above.

FIG. 1 illustrates a portion of a casing wall 1 of metallic material, e.g. aluminium, included in a casing for electronic components which is to be shielded. Together with three other walls and a bottom plate, the wall 1 may form an open box for the components, the box being covered by a lid or cover. The bottom plate and the four side walls can be connected together so that an effective contact is obtained for shielding. The problem is, however, to obtain good contact between the removable lid and the box as well. For this purpose perforations 3 are punched out along the upper edge 1a of the wall 1, and a strip 2 of metallic material is arranged in the perforations 3 so that the strip serpentines its way through the sheet material of the wall. FIG. 2 illustrates more closely how the strip 2, by the way it is placed, has obtained a wave configuration through the sheet and good contact is obtained at the engagement areas of the strip against the edges of the perforations 3. In the embodiment illustrated in FIGS. 1 and 2 the perforation 3 has been formed as a cut-out at right-angles to the edge surface 1a, with a narrower upper and a wider lower part 3a and 3b, respectively. Other implementations of the perforations 3 are of course conceivable for achieving the illustrated wave configuration of the strip 2. The desired wave configuration can be obtained by varying the distances $d_1$, $d_2$ between consecutive perforations 3, 4, 5. Resilient contact surfaces A are thus obtained, which can engage against a further casing wall or lid.

Figure 3A:
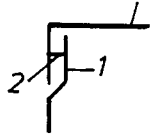
FIGS. 3a, 3b, 4a, 4b, 5a, 5b, 6a, 6b schematically illustrate various embodiments of the contacting device in accordance with the invention.
Figure 3B:
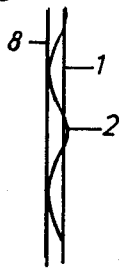

FIGS. 3a, 3b illustrate an embodiment of the contacting device in a side view and from above, respectively. A lid 8 has been placed on the casing wall 1, the resilient contact surfaces A engaging with good contact against the inner surface of the lid 8.

Figure 4A:
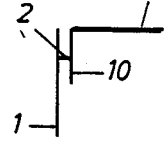
Figure 4B:
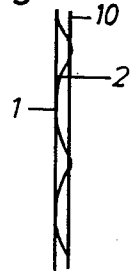

In the same views, FIGS. 4a, 4b illustrate a lid with resilient contact between the inner surface of the casing wall 1 and the outer surface of the lid flange.

Figure 5A:
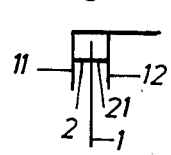
Figure 5B:
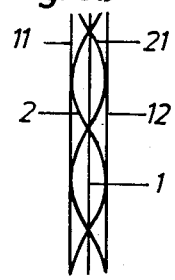

In the same views, FIGS. 5a, 5b illustrate a combination of cover-lid according to FIGS. 3a, 3b and 4a, 4b. In this case a further contact strip 21 has been placed in the perforations, and will thus lie above (or underneath) the strip 2 in the wider portion 3b of FIG. 1. It is thus possible to obtain contact surfaces on either side of the casing wall 1 in this way.

Figure 6A:
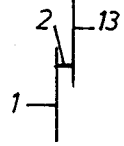
Figure 6B:
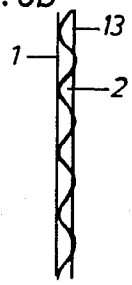

FIGS. 6a, 6b finally illustrate how a further loose casing wall 13 can be joined to the wall 1, achieving good contact effect at the same time. In this case the perforations 3 can either be stamped out in the wall 1 or in the wall 13 along the respective edge.

The simplicity of the contacting device in accordance with the invention makes it cheap in manufacture and easy to adjust to different contact requirements. The strip or wire 2 may have a circular, quadratic or other cross section. Different properties can be achieved by altering the following parameters:

Cross-sectional dimensions
The wire material
The distances $d_1$, $d_2$ between the perforations (3)
The widths of the perforations 3
Use of more than one wire or strip (2, 21) in the same perforation
Allowing or not allowing strips to intersect at the perforation The advantages attained with the inventive contacting device are mainly as follows:

It permits movement in the engaging surfaces in all directions
It is easy and quick to fit
The strip is self-cleaning
It is easy to modify the spring bias It is easy to obtain different amounts of deflection in resilient surfaces It permits different material and material thicknesses It is durable and without sharp edges Does not scratch engagement surfaces The wire or strip does not require any bending or punching The wire or strip can be taken directly from the manufacturer's reel during fitting There will now be obvious to those skilled in the art many modifications and variations of the above structure. These modifications and variations will not depart from the scope of the invention if defined by the following claims.

What is claimed is:

1. A contacting device for shielding electronic components against electromagnetic radiation, said device comprising a metallic casing having removable sheet metal walls, a contact strip achieving electrically conductive contact between the sheet metal walls, the contact strip comprises a flexible elongate band, continuously extending along one of said sheet metal walls, and retaining means for the strip in the form of cut-outs along the edge of the wall, the strip being fixed in said cutouts so that the strip is given a continuous wave form running on both sides of the wall.

2. A contacting device as claimed in claim 1, wherein each cutout has a narrower portion and a wider portion, said strip being placed in the wider portion and engaging against the edge thereof.

* * * * *